(12) United States Patent
Raebiger et al.

(10) Patent No.: US 7,041,434 B2
(45) Date of Patent: May 9, 2006

(54) TECHNIQUE FOR ENHANCING ACCURACY OF CRITICAL DIMENSIONS OF A GATE ELECTRODE BY USING CHARACTERISTICS OF AN ARC LAYER

(75) Inventors: Jan Raebiger, Dresden (DE); André Holfeld, Schirgigswalde (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/813,374

(22) Filed: Mar. 30, 2004

(65) Prior Publication Data

US 2005/0048417 A1 Mar. 3, 2005

(30) Foreign Application Priority Data

Aug. 29, 2003 (DE) ................. 103 39 992

(51) Int. Cl.
*G03F 7/00* (2006.01)
*G03F 7/36* (2006.01)
(52) U.S. Cl. .................... 430/316; 430/313
(58) Field of Classification Search ........... 430/316, 430/313
See application file for complete search history.

(56) References Cited

U.S. PATENT DOCUMENTS

| | | | |
|---|---|---|---|
| 5,926,690 A | 7/1999 | Toprac et al. ............... 438/17 |
| 5,939,130 A | 8/1999 | Shiraishi et al. ............... 427/9 |
| 6,004,047 A | 12/1999 | Akimoto et al. ............ 396/604 |
| 6,072,191 A | 6/2000 | La et al. ...................... 257/48 |
| 6,107,172 A * | 8/2000 | Yang et al. ................. 438/585 |
| 6,221,787 B1 | 4/2001 | Ogata ......................... 438/758 |
| 6,352,922 B1 * | 3/2002 | Kim ........................... 438/648 |
| 6,362,111 B1 * | 3/2002 | Laaksonen et al. ......... 438/725 |
| 6,514,871 B1 | 2/2003 | Yang et al. ................. 438/725 |
| 6,555,472 B1 * | 4/2003 | Aminpur .................... 438/669 |
| 2002/0180986 A1 | 12/2002 | Nikoonahad et al. ....... 356/600 |
| 2003/0003607 A1 | 1/2003 | Kagoshima et al. ......... 438/14 |

FOREIGN PATENT DOCUMENTS

| | | |
|---|---|---|
| DE | 100 51 380 A1 | 8/2002 |
| EP | 0 810 633 A2 | 12/1997 |
| EP | 0 810 633 A3 | 9/1998 |
| JP | 11340134 | 10/1999 |

* cited by examiner

*Primary Examiner*—Nicole Barreca
(74) *Attorney, Agent, or Firm*—Williams, Morgan & Amerson, P.C.

(57) ABSTRACT

In an improved technique for adjusting an etch time of a resist trim process, additional measurement data representing an optical characteristic, such as the reflectivity of an anti-reflective coating, is used. Since the initial thickness of the resist mask features may significantly depend on the optical characteristics of the anti-reflective coating, the additional measurement data allow compensation for process variations more efficiently as compared to the conventional approach.

21 Claims, 3 Drawing Sheets

TECHNIQUE FOR ENHANCING ACCURACY OF CRITICAL DIMENSIONS OF A GATE ELECTRODE BY USING CHARACTERISTICS OF AN ARC LAYER

BACKGROUND OF THE INVENTION

1. Field of the Invention

The present invention generally relates to the fabrication of integrated circuits, and, more particularly, to the formation of small circuit elements, such as a gate electrode of a field effect transistor, on a substrate, wherein the dimensions of the circuit elements are significantly less than the resolution of the involved lithography technique.

2. Description of the Related Art

The trend in recent years to steadily decrease the feature sizes of elements in micro-structures, such as circuit elements in integrated circuits, will continue in the near future, wherein reproducible and robust processes have to be established that allow the formation of a huge number of integrated circuits in a cost efficient manner. Presently, sophisticated integrated circuits that are available as mass products include elements having dimensions which are well below the optical resolution of the lithography apparatus used for transferring a pattern from a mask into a material layer formed on a substrate. Minimum dimensions of circuit elements are presently 100 nm and less, wherein the wavelength of radiation used for optically transferring patterns from the mask to the substrate surface is in the deep ultraviolet range at a wavelength of, e.g., 248 nm, and, according to recent developments, at approximately 193 nm. In this wavelength range, the absorption of optical transmissive elements, such as lenses, is considerable and will drastically increase with a further reduction of the wavelength. Thus, merely reducing the wavelength of light sources for lithography apparatus is not a straightforward development and may not easily be implemented in mass production of circuit elements having feature sizes of 50 nm and less.

The total resolution of reliably transferring circuit patterns from a mask to a substrate is determined, on the one hand, by the intrinsic optical resolution of the photolithography apparatus, the characteristics of materials involved in the photolithography patterning process, such as the photoresist and any anti-reflective coatings (ARC) that are provided to minimize deleterious scattering and standing wave effects in the photoresist, and by deposition and etch procedures involved in forming the resist and ARC layers and etching these layers after exposure. In particular, the highly non-linear behavior of the photoresist, in combination with sophisticated ARC layers and lithography mask techniques, allows the formation of resist patterns having dimensions considerably below the intrinsic optical resolution of the photolithography apparatus. Additionally, a further post-lithography trim etch process is applied to further reduce the feature sizes of the resist pattern that will serve as an etch mask in subsequent anisotropic steps for transferring the resist pattern into the underlying material layer. Thus, this resist trim process enables reduction of the critical dimension of the gate electrode to a size that is well beyond the wavelength of the photolithography.

It is, however, of great importance to accurately control the resist trim process so as to form a precisely defined mask for the subsequent anisotropic etch process for patterning the gate layer stack, since any variation of the gate length directly translates into a corresponding variation of operating speed of the final device.

With reference to FIGS. 1a–1c, a typical conventional process flow for forming a gate electrode of a field effect transistor including a control regime for the resist etch trim will now be described in more detail. FIG. 1a schematically shows a cross-sectional view of a semiconductor device 100 during an early stage of the fabrication of a line-like circuit element, such as the gate electrode of a field effect transistor. The semiconductor device 100 comprises a substrate 101, for instance a silicon substrate, or any other appropriate substrate with a suitable semiconductive layer formed thereon. A layer stack 102, for instance appropriately configured so as to enable the formation of a gate electrode, is formed on the substrate 101 and may include a gate insulation layer 103 and a gate material layer 104, such as a polysilicon layer. An anti-reflective coating 105 of appropriate thickness and material composition, for instance, comprised of silicon enriched silicon nitride, silicon oxynitride, and the like, is formed on the layer stack 102, followed by a resist mask feature 106 having an initial lateral size, which is referred to as $D_{initial}$, wherein the lateral size $D_{initial}$ is oriented along a length direction, i.e., the horizontal direction in the plane of FIG. 1a, of a gate electrode to be formed from the layer stack 102.

A typical process flow for forming the semiconductor device 100 as shown in FIG. 1a may comprise the following processes. First, the layer stack 102 is formed, for instance by forming the gate insulation layer 103 using advanced oxidation and/or deposition methods as are well known in the art. Subsequently, the polysilicon layer 104 may be deposited by chemical vapor deposition (CVD), followed by the deposition of the anti-reflective layer 105, the thickness and a material composition of which are selected so as to significantly reduce a back reflection of radiation during a subsequent lithography process. The thickness may typically range from 30-150 nm for a silicon rich nitride layer that may be formed by thermal CVD, plasma enhanced CVD, and the like, while controlling the material composition during the deposition process. Next, a resist layer comprised of a deep UV-sensitive material is deposited, for instance by spin-on techniques, and is subsequently exposed to a deep UV radiation having a wavelength of, for example, 248 nm or 193 nm. After development of the resist layer, including any well-known pre- and post-development procedures such as baking and the like, the resist mask feature 106 is formed having the lateral dimension $D_{initial}$, which may be significantly greater than a desired gate length $D_{target}$ of the gate electrode still to be formed. As previously explained, even for a highly non-linear behavior of the photoresist used, the lateral size $D_{initial}$ of the resist mask feature 106 still significantly exceeds the required target value by about 30–50%, especially as the critical feature size $D_{target}$ is on the order of 100 nm and significantly less. For this reason, the etch process for forming the gate electrode includes a first step for reducing the size of the resist mask feature 106 in a well-controlled manner prior to etching the anti-reflective coating 105 and the polysilicon layer 104 by using the resist mask feature 106 having the reduced size as an etch mask. To this end, an appropriately selected etch chemistry is provided in a gate etch tool, wherein the material removal of the resist mask feature 106, i.e., the reduction of the lateral size $D_{initial}$ and of course of the height of the resist mask feature 106, may depend substantially linearly on the etch time for a plurality of available resists. Hence, the etch time of the resist trim process may be calculated in advance on the basis of a linear model requiring as input parameter values of the lateral size $D_{initial}$ and the desired critical dimension $D_{target}$. The required etch time for the resist trim process may therefore be calculated on the basis of the following equation:

$$D_{target}=D_{initial}-a \cdot t-c,$$

wherein the coefficients a and c may be determined from a corresponding trim curve relating the etch time to the material removal of the resist for a plurality of test substrates that have been processed by the gate etch tool operated by a specified resist trim recipe.

FIG. 1b schematically shows the semiconductor device 100 after completion of the resist trim process, wherein the lateral size $D_{initial}$ is reduced by the amount of $2 \cdot \Delta D$, wherein $\Delta D$ may be controlled by accordingly adjusting the etch time to the value obtained by the model explained above. Hence, a resist mask feature 106A is formed having a lateral size that substantially corresponds to the desired critical dimension $D_{target}$, wherein a deviation from this target value depends on the linear trim etch model and the uniformity of the gate etch tool over time. Thereafter, the reactive atmosphere in the gate etch chamber is correspondingly altered so as to provide a highly anisotropic etch ambient that enables the etching of the anti-reflective coating 105 and the polysilicon layer 104, wherein a high selectivity to the gate insulation layer 103 is required so as to not unduly damage the underlying substrate 101 when the etch front stops within the thin gate insulation layer 103.

FIG. 1c schematically shows the semiconductor device 100 after the completion of the anisotropic etch process, thereby forming a gate electrode 104A, while the residue 105A of the anti-reflective coating 105 and the residue of the resist mask feature 106A cover the top surface of the gate electrode 104A. The lateral dimension of the gate electrode 104A, i.e., the gate length, is denoted as $D_{final}$, which should substantially conform to the desired critical dimension $D_{target}$, as any significant deviation therefrom would lead to a significantly changed device performance. In highly sophisticated integrated circuits, the desired critical dimension of the gate length may be significantly less than 100 nm with a tolerance of ±1 nm.

In the conventional process flow as described above, the feed forward strategy, i.e., the measurement of the initial lateral size of the resist mask feature 106 as produced by the lithography process and the respective calculation of the etch time of the resist trim process for a substrate to be subsequently processed, is based on the assumption that all relevant variations of previously performed process steps that affect the gate etch process are sufficiently taken account of by the measurement value $D_{initial}$. Upon further device scaling, however, it turns out that it is extremely difficult to maintain the deviations of the gate length $D_{final}$ with respect to the target value $D_{target}$ within the required margins by the above explained feed forward strategy, since the values of $D_{initial}$ may exhibit a significant variance and the process may be subjected to systematic drifts over time, thereby rendering the conventional control strategy inefficient and thus significantly reducing the yield of the production process.

In view of this situation, there exists a need for an improved technique that enables the control of a critical dimension of a circuit element, such as a gate electrode, with an enhanced accuracy even if dimensions are further scaled.

SUMMARY OF THE INVENTION

Generally, the present invention is directed to a method and a control system in which fluctuations of the critical dimension of a circuit element are significantly reduced in that the process time of a resist trim process is controlled on the basis of the initial size of a resist mask feature and, additionally, by at least one optical property of an anti-reflective coating used to pattern the resist mask feature by photolithography. In one particular embodiment, the reflectivity of the anti-reflective coating may be determined and may be used as a parameter in determining the process time for the resist trim process.

According to a further illustrative embodiment of the present invention, a method comprises forming an anti-reflective coating and a resist layer on a material layer formed on a first substrate to be patterned to define a feature in the material layer having a desired critical dimension. At least one optical characteristic of the anti-reflective coating is determined and a resist feature is formed above the anti-reflective coating by photolithography. A size of the resist feature is reduced by performing an etch process that is controlled on the basis of an initial size of the resist feature, the desired critical dimension of the feature in the material layer and at least one optical characteristic of the anti-reflective coating.

According to another illustrative embodiment of the present invention, a method of forming a gate electrode of a field effect transistor comprises forming a gate layer stack above a substrate and forming an anti-reflective coating on the gate layer stack. A resist mask feature is formed above the anti-reflective coating, wherein the resist mask feature has an initial critical dimension. At least one optical characteristic of the anti-reflective coating is determined and a size of the resist mask feature is reduced by an etch process, wherein an etch time of the etch process is controlled on the basis of the initial critical dimension, a desired critical dimension, and at least one optical characteristic. Finally, the gate layer stack and the anti-reflective coating are etched, wherein the resist mask feature having the reduced size is used as an etch mask.

According to still another illustrative embodiment of the present invention, an etch control system comprises an etch tool and a control unit that is operatively connected to the etch tool so as to enable the adjustment of a duration of at least one etch phase. The control unit is configured to receive measurement data representing a critical dimension of a resist feature and at least one optical characteristic of an anti-reflective coating used to form the resist feature. Additionally, the control unit is further configured to determine an etch time for at least one etch phase to reduce a size of the resist feature on the basis of the received measurement data.

BRIEF DESCRIPTION OF THE DRAWINGS

The invention may be understood by reference to the following description taken in conjunction with the accompanying drawings, in which like reference numerals identify like elements, and in which.

Figure 1A:
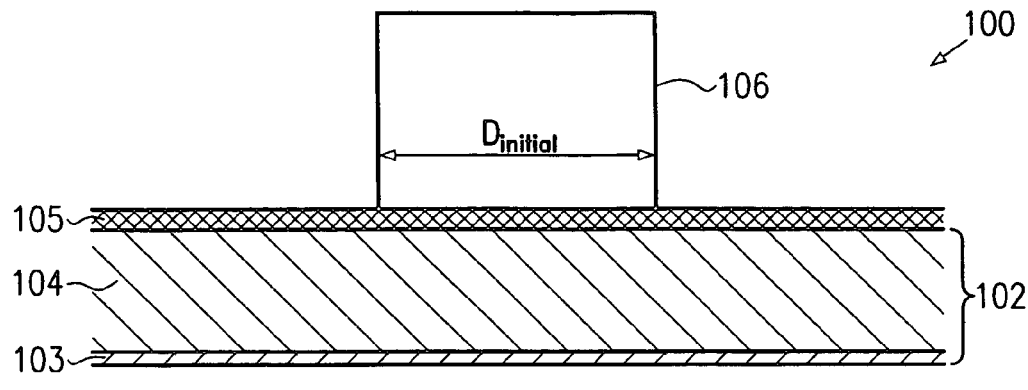
FIGS. 1a–1c schematically show cross-sectional views of a semiconductor device during various manufacturing stages in forming a circuit element with a lateral size that is substantially controlled by a resist trim process in accordance with a conventional process technique.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
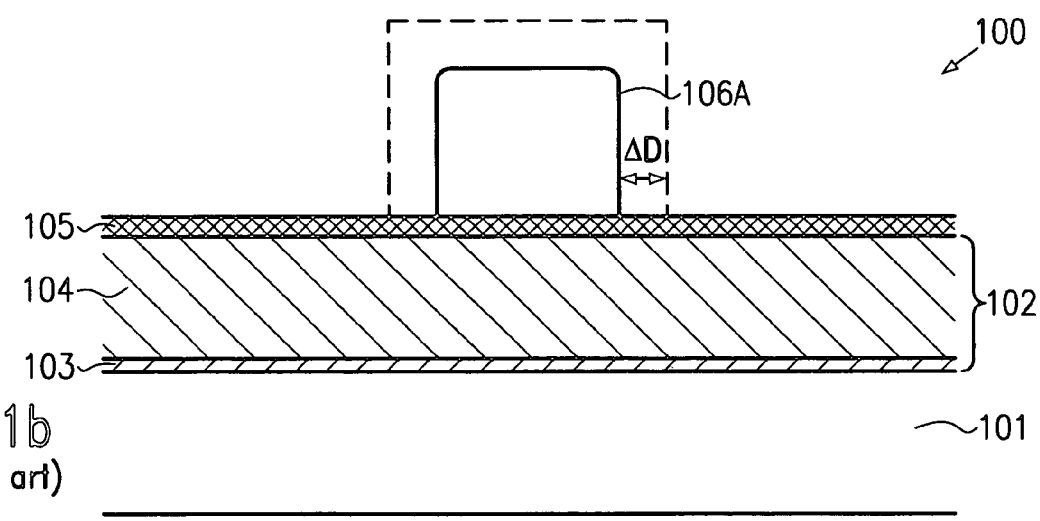
Figure 1C:
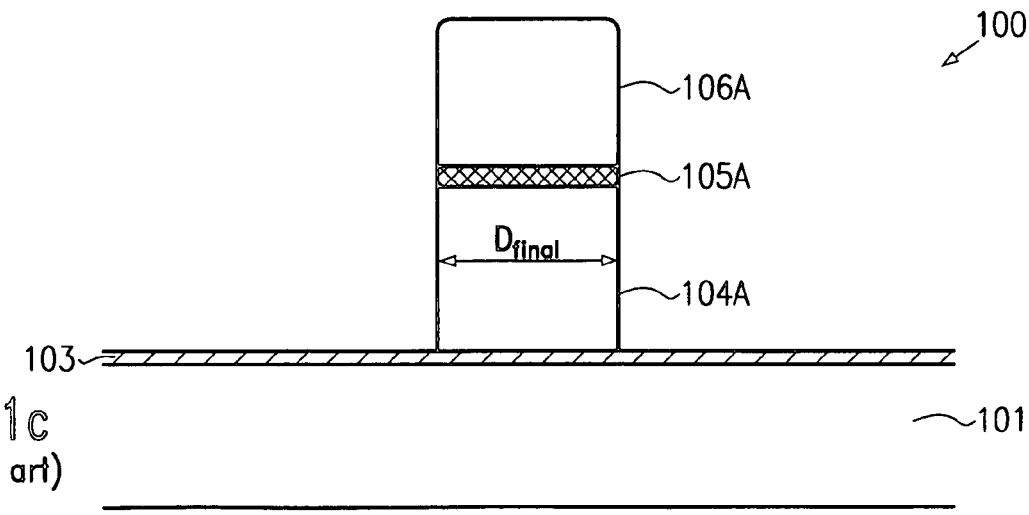

In the following, further illustrative embodiments of the present invention will be described with reference to accompanying drawings, wherein, for convenience, FIGS. 1a to 1c are also referred to when appropriate.

As previously explained, the conventional feed forward strategy is based on measurement data of the initial dimension of a resist mask feature and a linear model of the trim etch process for reducing the size of the resist mask feature. It turns out, however, that the measurement data representing the initial lateral size of the resist mask feature for different substrates exhibits a significant fluctuation that has to be efficiently compensated for so as to keep the final critical dimension within strict process margins. Moreover, the etch process may experience a certain degree of process variation over time, which may not to be efficiently compensated in the linear model described earlier by an according process control algorithm. The relatively large fluctuations in the initial size of the resist mask feature in combination with a systematic drift of the etch process may place a great burden on the control process based on the measurement data of the initial size, representing the feed forward input parameter. Especially if a systematic dependence of a preceding process is significant, the input parameter of the feed forward control strategy may exhibit a high error and may therefore cause an unacceptable deviation from the target value, thereby significantly reducing production yield.

It has been recognized that the input parameter, such as the initial lateral size $D_{initial}$ of the resist mask feature 106 as described with reference to FIG. 1*a*, may significantly depend on the optical characteristics of the underlying anti-reflective coating 105, wherein the optical characteristics may be represented, according to one particular embodiment of the present invention, by the reflectivity of the anti-reflective coating 105. In this respect, it is to be noted that the optical characteristics of an anti-reflective coating, such as the layer 105 of FIG. 1*a*, may preferably be defined with respect to a specified wavelength or wavelength range and may be adjusted by correspondingly selecting a thickness, a material composition, and a specified process, generating a specific structure for forming the anti-reflective coating. For instance, the anti-reflective coating 105 may be provided in the form of basically a silicon nitride layer, the hydrogen and oxygen content of which may be adjusted by deposition parameters so as to correspondingly obtain a specified index of refraction and a specified extinction coefficient for the specified wavelength or wavelength range. Additionally, the thickness of the anti-reflective coating 105 may be controlled during the deposition so as to provide a required optical thickness for achieving the desired optical effect of reducing a backscattering of light into a resist layer formed on the anti-reflective coating 105. Thus, the optical characteristics of the anti-reflective coating 105 may depend on the material composition, the structure of the materials produced by a specified deposition technique, and the final layer thickness, wherein a fluctuation of one of these parameters may lead to a corresponding variation in the optical characteristics. Hence, any minor process variations during the formation of the anti-reflective coating 105 may significantly contribute to the distinct fluctuation of the size of the resist feature that are caused by other processes.

The behavior of the anti-reflective coating 105 may be conveniently obtained by determining the reflectivity thereof at a predefined wavelength, which may—but does not necessarily need to—be the exposure wavelength used in the subsequent photolithography.

Figure 2A:
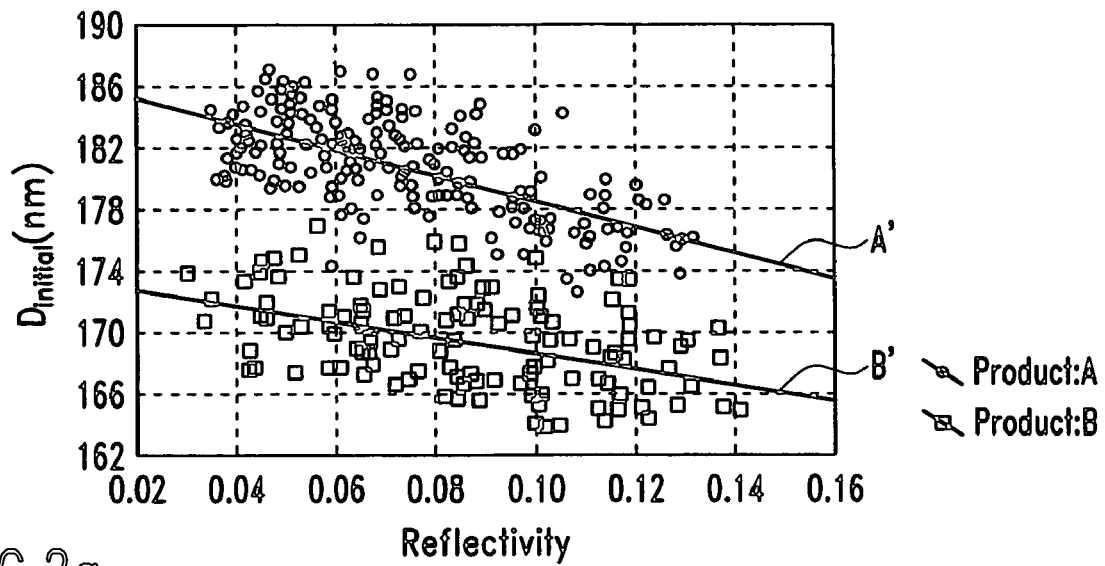
FIGS. 2a and 2b show scatter plots of the initial lateral size of a resist mask feature versus the reflectivity of an anti-reflective coating (FIG. 2a) and the etch bias, i.e., the initial lateral size minus the final lateral size versus the reflectivity of the anti-reflective coating (FIG. 2b)

FIG. 2*a* schematically shows a scatter plot representing the dependence of the initial size $D_{initial}$ of the resist mask feature 106 on the reflectivity of the anti-reflective coating 105 for a specified wavelength for two different product types A and B, which may differ, for instance, in their basic design, their process history, and the like. Due to the differences between the products A and B, although each contains a device structure as shown, for example, in FIG.

1a, they may exhibit different lateral sizes $D_{initial}$. In FIG. 2a, product A, represented by circles, typically has a higher average $D_{initial}$ compared to product B, represented by squares, wherein at the same time a significant dependence on the reflectivity is indicated by FIG. 2a. The respective lines A' and B' are respective linear fits on the corresponding measurement data of the products A and B.

Figure 2B:
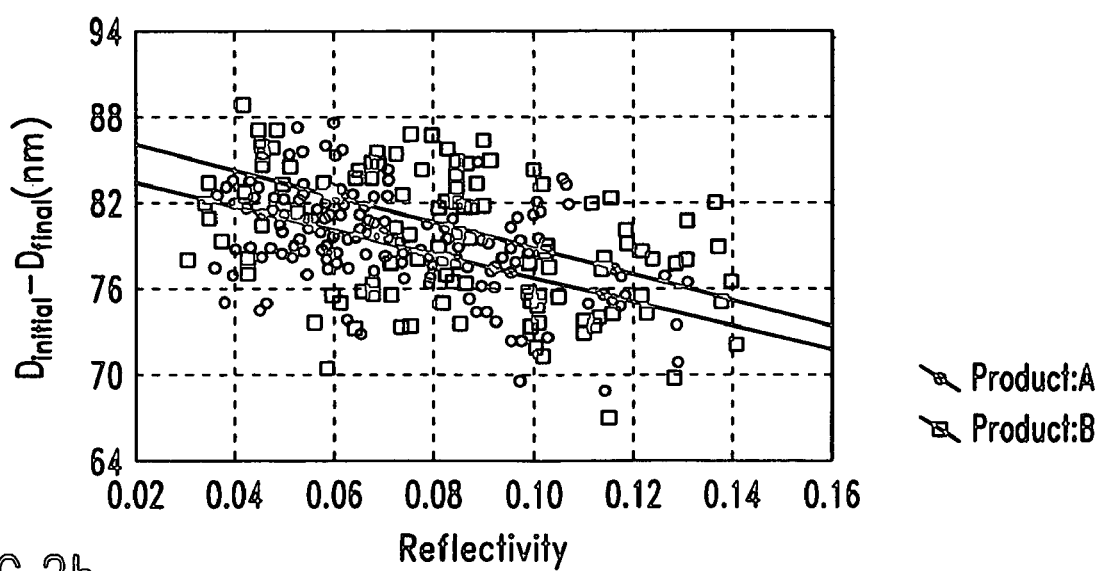

FIG. 2b shows a scatter plot illustrating the etch bias, i.e., the difference of the initial critical dimension $D_{initial}$ (see FIG. 1c) and the final size $D_{final}$ (see FIG. 1c) of the resist mask feature 106 versus the reflectivity of the anti-reflective coating 105. Similar to FIG. 2a, both products A and B show a significant variation with the reflectivity, thereby indicating the significance of the optical characteristics of the anti-reflective coating 105 on the resulting final critical dimension $D_{final}$.

The present invention is therefore based on the concept to use measurement data representing at least one optical characteristic of the anti-reflective coating 105 for controlling the resist trim process. In one particular embodiment, a plurality of measurement data may be obtained for a specified process flow for forming an anti-reflective coating, such as the layer 105, wherein one or more process parameters, such as thickness, material composition, and the like, are varied so as to obtain varying optical characteristics of the anti-reflective coating, as is shown in one example in FIG. 2a for two different product types having an anti-reflective coating, the reflectivity of which varies between approximately 0.03 and 0.14. Thus, in this case, the optical characteristic is represented by the reflectivity at a specified wavelength or wavelength range, wherein the specified wavelength or wavelength range may correspond to the measurement range of an appropriate metrology tool. In other embodiments, a wavelength dependence of the reflectivity may be substantially eliminated by using the same wavelength as is used during the photolithography process under consideration. From the correspondingly obtained measurement data, one or more corresponding correction coefficients may be determined that substantially compensate for or at least reduce the dependency between the at least one optical characteristic and the initial size $D_{initial}$.

For instance, in FIG. 2a, the fit curve A' may be used so as to derive a corresponding correction coefficient(s) for the product type A so that the dependency on a reflectivity fluctuation may substantially be compensated for. After having established one or more corresponding correction coefficients, the resist trim process may then be controlled on the basis of measurement data representing the at least one optical characteristic, which is corrected with the established correction coefficient(s), and on the basis of a linear model, as is described with reference to FIG. 1b. It should be noted that the term coefficient(s) refers to mathematical expression that enables a quantitative manipulation of measurement data, wherein the coefficient(s) preferably represent one or more discrete values, since this form of representation is suitable for a numerical processing in a microprocessor or any other digital circuit. However, a continuous or "analogous" representation may also be considered appropriate. For instance, the linear fit function A' or B' may enable the determination of a single correction coefficient, i.e., the inverse slope of the curves A' or B', so as to suppress the influence of the reflectivity variation. If a non-linear relation is indicated by the measurement data or is per se considered more appropriate, a plurality of respective coefficients may be established.

In one particular embodiment, the process time for the resist trim process may be calculated on the basis of the following equation:

$$D_{target} = D_{initial} - a \cdot t - c - K \cdot R_{anti}$$

wherein K represents the correction coefficient and $R_{anti}$ represents a measurement value of the at least one optical characteristic, such as the reflectivity of the anti-reflective coating 105. In a further embodiment, the finally-obtained critical dimension $D_{final}$ may also be entered into the control strategy so as to add a feedback component that may compensate for a deviation of the actually achieved final critical dimension $D_{final}$ compared to the target value $D_{target}$. While a portion of the model based on the initial lateral size $D_{initial}$ and the measurement data representing the at least one optical characteristic and the desired critical dimension $D_{target}$ may provide for a significant compensation for process fluctuations, the feedback component, i.e., the finally achieved critical dimension $D_{final}$, provides a continuous adaptation of the actual critical dimension $D_{final}$ to the target value $D_{target}$. Otherwise, a divergence may occur that may increase over time caused by a systematic variation over time of the etch process.

Figure 3:
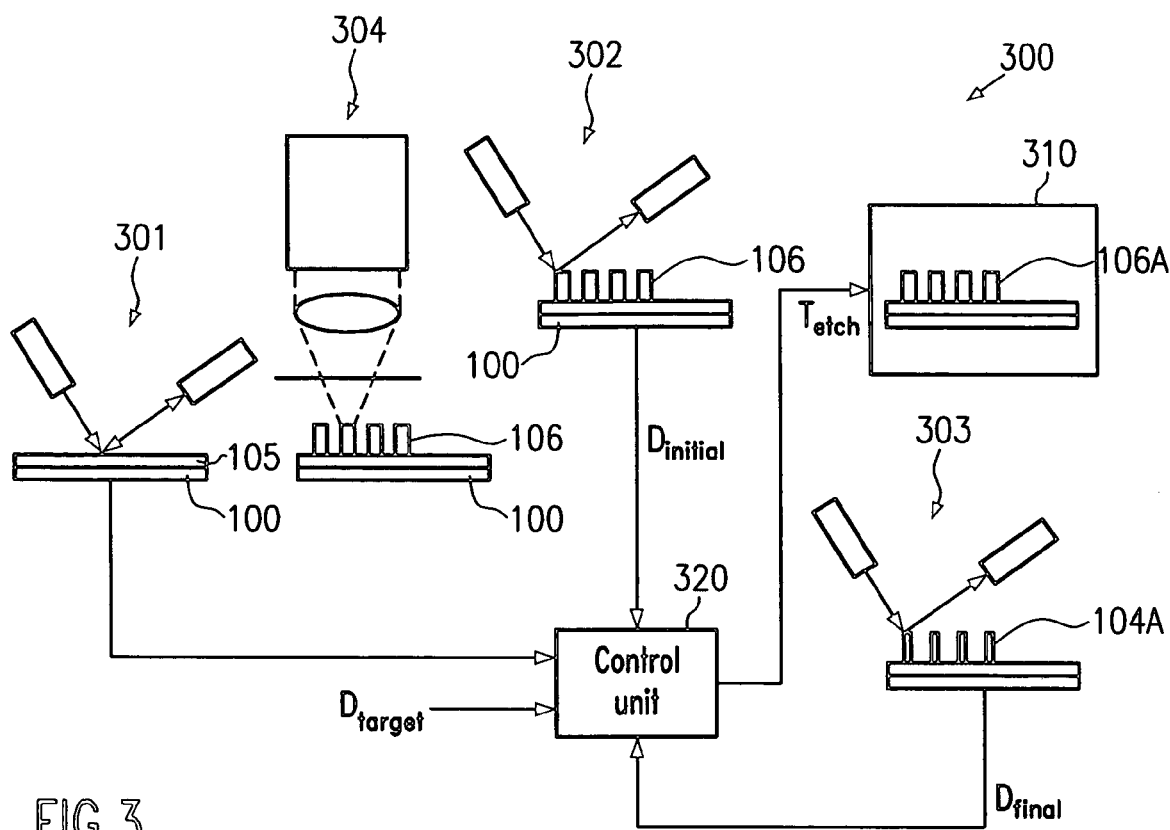
FIG. 3 schematically shows a system for controlling a resist trim process in accordance with illustrative embodiments of the present invention.

FIG. 3 schematically shows a control system 300 that is based on the above-explained control strategy for forming a circuit element having a well-defined critical dimension. The control system 300 comprises an etch tool 310, which is configured to perform an etch process by using a resist mask feature as an etch mask, wherein an initial phase of the etch process enables the size reduction of the resist mask feature. Thus, the etch tool 310 is configured to provide an appropriate etch atmosphere with a required accuracy and stability over time. The control system 300 further comprises a control unit 320 that is configured to obtain measurement data R, $D_{initial}$ representing at least one optical characteristic such as the reflectivity of the anti-reflective coating and an initial lateral size of a resist mask feature, respectively. The corresponding measurement data R, $D_{initial}$ may be delivered by corresponding metrology tools 301 and 302, which are well known in the art and therefore a detailed description is omitted here. The control unit 320 may further be adapted to receive a desired critical dimension $D_{target}$, which may be entered into the control unit 320 by an operator, a facility management system, and any other appropriate sources. The control unit 320 is further configured to establish a parameter value on the basis of the measurement data R, $D_{initial}$ and the desired critical dimension $D_{target}$ so as to correspondingly control the etch tool 310. For instance, the control unit 320 may have implemented an algorithm to calculate the etch time $T_{etch}$ for a resist trim process as is described with reference to FIGS. 1a–1c.

In one particular embodiment, the control unit 320 may further be configured to receive measurement data $D_{final}$, representing the finally achieved critical dimension after completion of the etch process of the etch tool 310. The corresponding measurement data $D_{final}$ may be supplied by a corresponding metrology tool 303.

During the operation of the control system 300, a semiconductor device such as the device 100 comprising a material layer to be patterned, such as the gate layer stack 102 and the anti-reflective coating 105, may be formed and may be subjected to a corresponding measurement of the at least one optical characteristic, such as the reflectivity, by the metrology tool 301, thereby generating the measurement data R. Thereafter, a resist layer may be formed and the corresponding resist layer may be exposed by a lithography system 304 to produce the resist mask features 106.

If the at least one optical characteristic may be determined by a measurement wavelength or wavelength range that does not substantially affect the integrity of the resist layer, the measurement data R may be obtained after the application of the resist layer. Similarly, the measurement data R may be obtained after having formed the resist mask feature 106.

Then, the critical dimension $D_{initial}$ of the resist mask feature 106 is determined by the metrology tool 302, thereby producing the measurement data $D_{initial}$. Next, the device 100 is conveyed to the etch tool 310, while the control unit 320 determines the value of a relevant control parameter of the resist trim process, such as the etch time $T_{etch}$ on the basis of the received measurement data R, $D_{initial}$, and the target value $D_{target}$. In some embodiments, the measurement data $D_{final}$ of one or more previously processed semiconductor devices 100 may also be used for establishing the value for the process parameter $T_{etch}$. As previously discussed, the additional information conveyed by the measurement data R enables more precise control of the size resist mask features 106A having the reduced lateral size, and thus of the final gate electrode 104A. Finally, after completion of the etch process, the measurement data $D_{final}$ of the gate electrodes 104a may be created by the measurement tool 303.

In other embodiments, a plurality of product substrates may be processed on the basis of the control parameter of the resist trim process, for instance, the etch time, that is determined from one or more previously processed substrates. For example, the measurement data may represent averaged values of a plurality of substrates to determine a representative trim etch time that may be used subsequently for a plurality of product substrates without requiring an adjustment of the control parameter for each individual product substrate.

Figure 4:
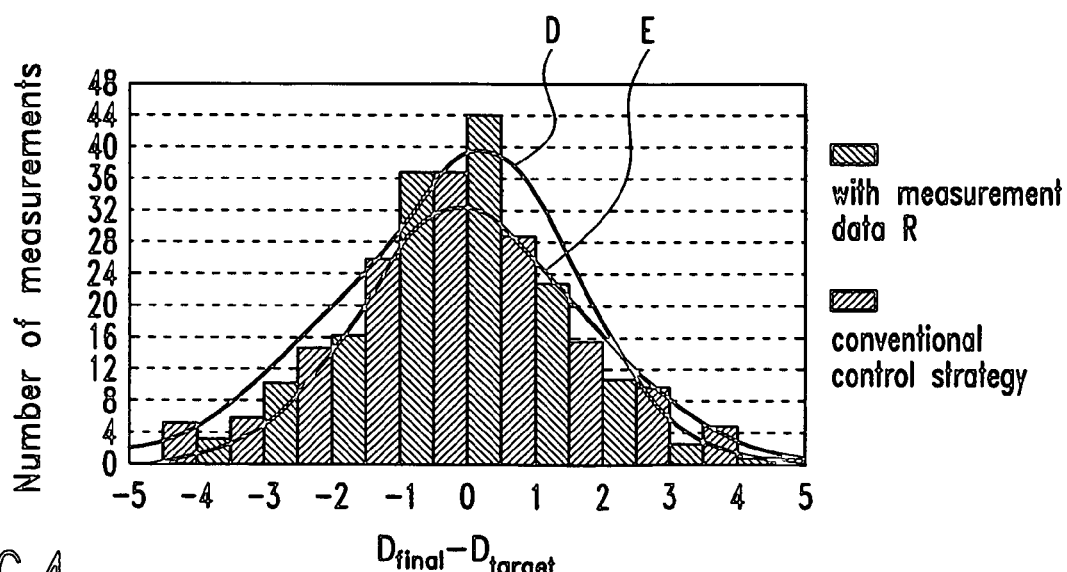
FIG. 4 shows a graph for comparing the deviation of a finally obtained critical dimension from a desired critical dimension for a typical conventional process flow and for a process technique according to one illustrative embodiment of the present invention.

FIG. 4 schematically shows a graph representing the deviation of the actually achieved final critical dimension $D_{final}$ from the target value $D_{target}$ for a plurality of substrates processed on the basis of a conventional control strategy (curve E) and on the basis of additional measurement data R, representing an optical characteristic of the anti-reflective coating 105 (curve D). As indicated by FIG. 4, the magnitude of the variations is less for curve D compared to curve E. Therefore, fluctuations of the initial critical dimension $D_{initial}$ may be compensated significantly more efficiently according to the present invention compared to the conventional control strategy, thereby increasing production yield and allowing the introduction of more strictly set process margins, which is required for a further device scaling.

As a result, the present invention provides a technique for controlling a resist trim process on the basis of additional measurement data representing an optical characteristic, such as the reflectivity of an anti-reflective coating, wherein, in one particular embodiment, the conventional linear model may be extended so as to include a correction coefficient that, in combination with the measurement data representing the optical characteristic, enable more efficient compensation for process variations of preceding processes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

The invention claimed is:

1. A method, comprising:
    forming an anti-reflective coating and a resist layer on a material layer formed on a first substrate and to be patterned to define a feature in said material layer having a desired critical dimension;
    determining at least one optical characteristic of said anti-reflective coating;
    forming a resist feature above said anti-reflective coating by photolithography; and
    reducing a size of said resist feature by performing an etch process that is controlled on the basis of an initial size of said resist feature, said desired critical dimension of said feature in said material layer and said at least one optical characteristic of said anti-reflective coating.

2. The method of claim 1, wherein said at least one optical characteristic represents at least one of a reflectivity and an extinction coefficient of said anti-reflective coating.

3. The method of claim 1, wherein controlling said etch process includes determining an etch time to reduce said size of said resist feature.

4. The method of claim 3, wherein said etch time is determined on the basis of a linear etch model.

5. The method of claim 1, further comprising etching said material layer with said resist feature having the reduced size to form said feature in said material layer.

6. The method of claim 5, further comprising determining an actual critical dimension of said feature and controlling said etch process on the basis of said actual critical dimension.

7. The method of claim 1, further comprising establishing a relationship between said at least one optical characteristic and said initial size of said resist feature to obtain at least one correction coefficient.

8. The method of claim 1, wherein said desired critical dimension is less than 100 nm.

9. The method of claim 1, wherein said at least one optical characteristic of said anti-reflective coating is determined before said resist layer is formed above said anti-reflective coating.

10. The method of claim 1, wherein said at least one optical characteristic of said anti-reflective coating is determined after said resist layer is formed above said anti-reflective coating.

11. The method of claim 1, further comprising determining at least one parameter for controlling said etch process and reducing a size of a resist mask feature formed on at least one second substrate on the basis of said at least one parameter.

12. The method of claim 11, wherein said at least one parameter represents an etch time of said etch process.

13. A method of forming a gate electrode of a field effect transistor, the method comprising:
    forming a gate layer stack above a substrate;
    forming an anti-reflective coating on said gate layer stack;
    forming a resist mask feature above said anti-reflective coating, said resist mask feature having an initial lateral size;
    determining at least one optical characteristic of said anti-reflective coating;
    reducing a size of said resist mask feature by performing an etch process, wherein an etch time of said etch process is controlled on the basis of said initial size, a desired critical dimension of said gate electrode and said at least one optical characteristic; and etching said gate layer stack and said anti-reflective coating by using said resist mask feature having the reduced size as an etch mask.

14. The method of claim 13, wherein said at least one optical characteristic represents at least one of a reflectivity and an extinction coefficient of said anti-reflective coating.

15. The method of claim 13, wherein said etch time is determined on the basis of a linear etch model.

16. The method of claim 13, further comprising determining an actual critical dimension of said gate electrode and controlling said etch process on the basis of the actual critical dimension.

17. The method of claim 13, further comprising establishing a relationship between said at least one optical characteristic and said initial size of said resist feature to obtain at least one correction coefficient.

18. The method of claim 13, wherein said desired critical dimension is less than 100 nm.

19. The method of claim 13, wherein said at least one optical characteristic of said anti-reflective coating is determined before said resist mask feature is formed above said anti-reflective coating.

20. The method of claim 13, wherein said at least one optical characteristic of said anti-reflective coating is determined after said resist mask feature is formed above said anti-reflective coating.

21. The method of claim 13, comprising determining said etch time for said substrate and using said determined etch time for forming a gate electrode on at least one further substrate.

* * * * *